(12) United States Patent
Allinger et al.

(10) Patent No.: US 6,392,259 B1
(45) Date of Patent: May 21, 2002

(54) SEMICONDUCTOR CHIP WITH SURFACE COVERING

(75) Inventors: Robert Allinger, Unterhaching; Wolfgang Pockrandt, Reichertshausen, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/377,605

(22) Filed: Aug. 19, 1999

(30) Foreign Application Priority Data

Aug. 19, 1998 (EP) .............................................. 98115621

(51) Int. Cl.⁷ .............................................. H01L 27/10
(52) U.S. Cl. ........................ 257/207; 257/208; 257/700; 257/203; 257/691
(58) Field of Search ................................. 257/922, 758, 257/503, 708, 725, 700, 48, 203, 205–211, 691; 365/91, 53, 206, 185.04, 120; 235/492

(56) References Cited

U.S. PATENT DOCUMENTS 4,434,361 A * 2/1984 Meinguss et al. ........... 235/192
4,716,314 A * 12/1987 Mulder et al. .............. 307/477

FOREIGN PATENT DOCUMENTS

| EP | 0 378 306 A2 | 7/1990 |
|---|---|---|
| EP | 0 764 985 A2 | 3/1997 |

OTHER PUBLICATIONS

International Patent Application WO 96/16445 (Beaumont), dated May 30, 1996.

* cited by examiner

*Primary Examiner*—Nathan Flynn
*Assistant Examiner*—Scott R Wilson
(74) *Attorney, Agent, or Firm*—Herbert L. Lerner; Laurence A. Greenberg; Werner H. Stemer

(57) ABSTRACT

A semiconductor chip with a surface covering includes circuits which are produced in at least one layer of a semiconductor substrate and disposed in at least one group. Supply and signal lines extend in at least one interconnect plane over at least one circuit group and have a maximum width so that a distance between each two lines is at a minimum.

2 Claims, 3 Drawing Sheets

SEMICONDUCTOR CHIP WITH SURFACE COVERING

BACKGROUND OF THE INVENTION

Field of the Invention

The invention relates to a semiconductor chip having circuits which are produced in at least one layer of a semiconductor substrate and disposed in at least one group, and supply and signal lines extending in at least one interconnect plane over the circuits.

Such a semiconductor chip is known from European Patent Application 0 378 306 A2. In that semiconductor chip, a first circuit group is disposed in a secured region and a second circuit group is disposed in a nonsecured region. In the known semiconductor chip, the first region is secured by a conductive layer which is disposed over the interconnect plane of the first circuit group. That conductive layer is electrically connected to the circuit group, and that circuit group is only capable of functioning as intended if the layer is intact.

The first circuit group in that case includes a microprocessor as well as associated peripheral circuits such as memories and a transfer logic circuit. The memories may, in particular, contain secret information. It is also conceivable for the microprocessor to have a special structure which is particularly well-suited to security-relevant functions. Espionage, such as through the use of a scanning electron microscope during the operation of the circuit, is prevented through the use of the conductive layer, the integrity of which is constantly checked.

However, that conductive layer requires a further process step in the production of the semiconductor chip. Furthermore, corresponding evaluation circuits are needed for detecting the integrity of the conductive layer.

SUMMARY OF THE INVENTION

It is accordingly an object of the invention to provide a semiconductor chip with a surface covering, which overcomes the hereinafore-mentioned disadvantages of the heretofore-known devices of this general type.

With the foregoing and other objects in view there is provided, in accordance with the invention, a semiconductor chip, comprising a semiconductor substrate having at least one layer; circuits produced in the at least one layer of the semiconductor substrate, the circuits disposed in at least one group; at least one interconnect plane disposed over the circuits; and supply and signal lines extending in the at least one interconnect plane over at least one group of the circuits, the supply and signal lines having a maximally large width defining a distance between each two of the supply and signal lines, the distance being at most approximately twice a minimum distance achievable according to a relevant state of a technology generation.

In accordance with a concomitant feature of the invention, the distance between two lines essentially corresponds approximately to the minimal distance achievable according to the relevant state of a technology generation.

This essentially means that the distance between lines along the majority of the respective line lengths is the minimum, or at most twice as great as the minimum. By virtue of this small distance, on one hand the chip surface is almost fully covered by the conductive interconnect layer which is required in any case and is protected against optical as well as electron-optical examination. On the other hand, extensive removal of the lines, in order to make it possible to carry out optical surface examination, would have the effect of causing the circuits to no longer function, without further detector circuits having been needed.

A merely point-wise removal of the lines, for example in order to separate circuits parts, would not succeed since welding of neighboring lines would result due to the small distance.

The widening of the lines is carried out during the layout of the topology of the semiconductor chip. In this case, the ground lines are initially configured to be as wide as possible in order to guarantee the best possible capacitive coupling of ground to the substrate, as well as to guarantee a low-impedance voltage supply with minimal coupling of the other signal lines to one another. In the next step, the supply voltage lines are widened. It is not until the end that the signal lines are widened, in order to ensure the least possible coupling of the signal lines to one another.

The widening of the lines according to the invention in at least one interconnect plane is carried out at least over security-critical circuit parts such as memories for secret codes or special encryption circuits. It is, however, advantageous to widen the lines over the entire surface, in order to give a prospective attacker no possible indication of where security-relevant circuit parts are to be found.

If there are several interconnect planes, it is possible to cover different circuit groups in different interconnect planes. It is also possible in this case for the coverings to overlap. Furthermore, in the case of several interconnect planes, it is possible to provide several complete coverings without an extra outlay.

Other features which are considered as characteristic for the invention are set forth in the appended claims.

Although the invention is illustrated and described herein as embodied in a semiconductor chip with a surface covering, it Be is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
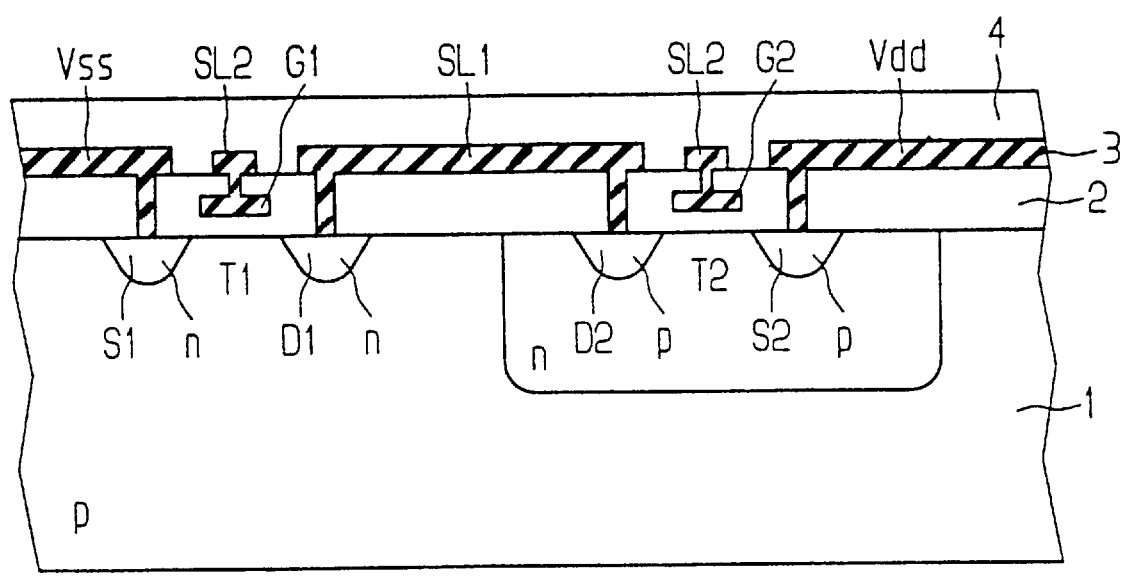
FIG. 1 is a fragmentary, diagrammatic, cross-sectional view of a semiconductor chip with a circuit plane and an interconnect plane.

Referring now to the figures of the drawings in detail and first, particularly, to FIG. 1 thereof, there is seen a cross-sectional representation of a p-conducting semiconductor substrate 1 in which a CMOS inverter is produced as an example of a circuit. This inverter is formed by an n-channel transistor T1 and a p-channel transistor T2.

An insulating layer 2, which is usually formed by silicon oxides, is disposed over an active layer of the semiconductor substrate 1. An interconnect plane 3 is disposed over this insulator layer 2. The interconnect plane 3 is formed of ground lines Vss, supply voltage lines Vdd as well as signal lines SL1, SL2. In order to produce the CMOS inverter, a source region S1 of the n-channel transistor T1 is connected through the insulator layer 2 to the ground line Vss. Both a drain region D1 of the n-channel transistor T1 and a drain region D2 of the p-channel transistor T2 are connected through the insulator layer 2 to the signal line SL1. A source region S2 of the p-channel transistor T2 is connected to the supply voltage line Vdd. Gate electrodes G1 and G2, which are disposed in the insulator layer 2, are each connected to a signal line SL2. A further protective layer in the form of a passivation layer 4 is customarily disposed over the interconnect plane 3. Although only one active layer and one interconnect plane 3 are actually shown in FIG. 1, the invention can likewise be implemented in the case of several active layers and/or several interconnect planes.

Figure 2:
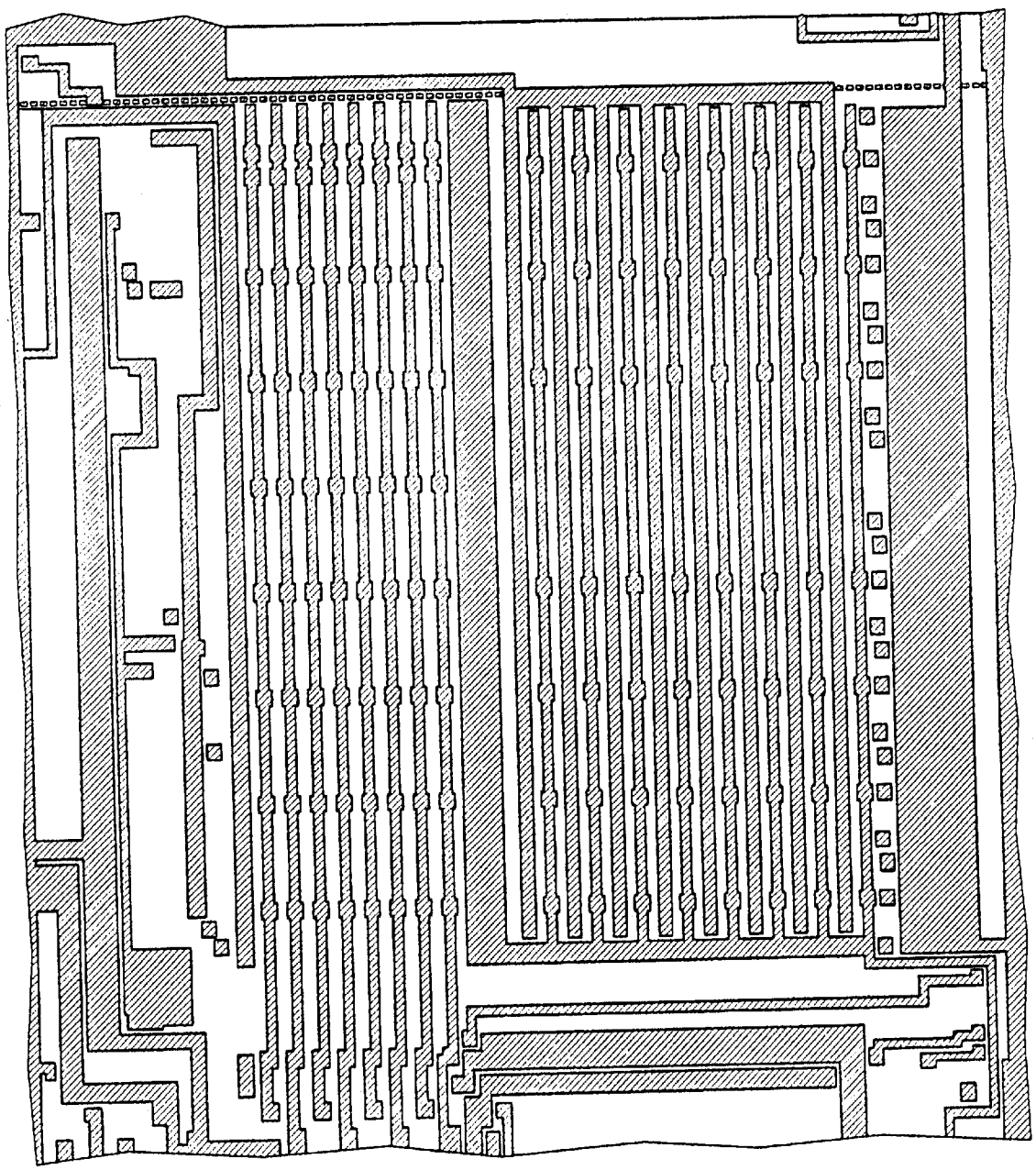
FIG. 2 is a fragmentary, sectional view of an interconnect lane according to the prior art.

FIG. 2 shows a portion of an interconnect plane according to the prior art. As can be seen, there are large gaps between the lines, so that under certain circumstances the underlying circuit structure can be investigated by optical measures.

Figure 3:
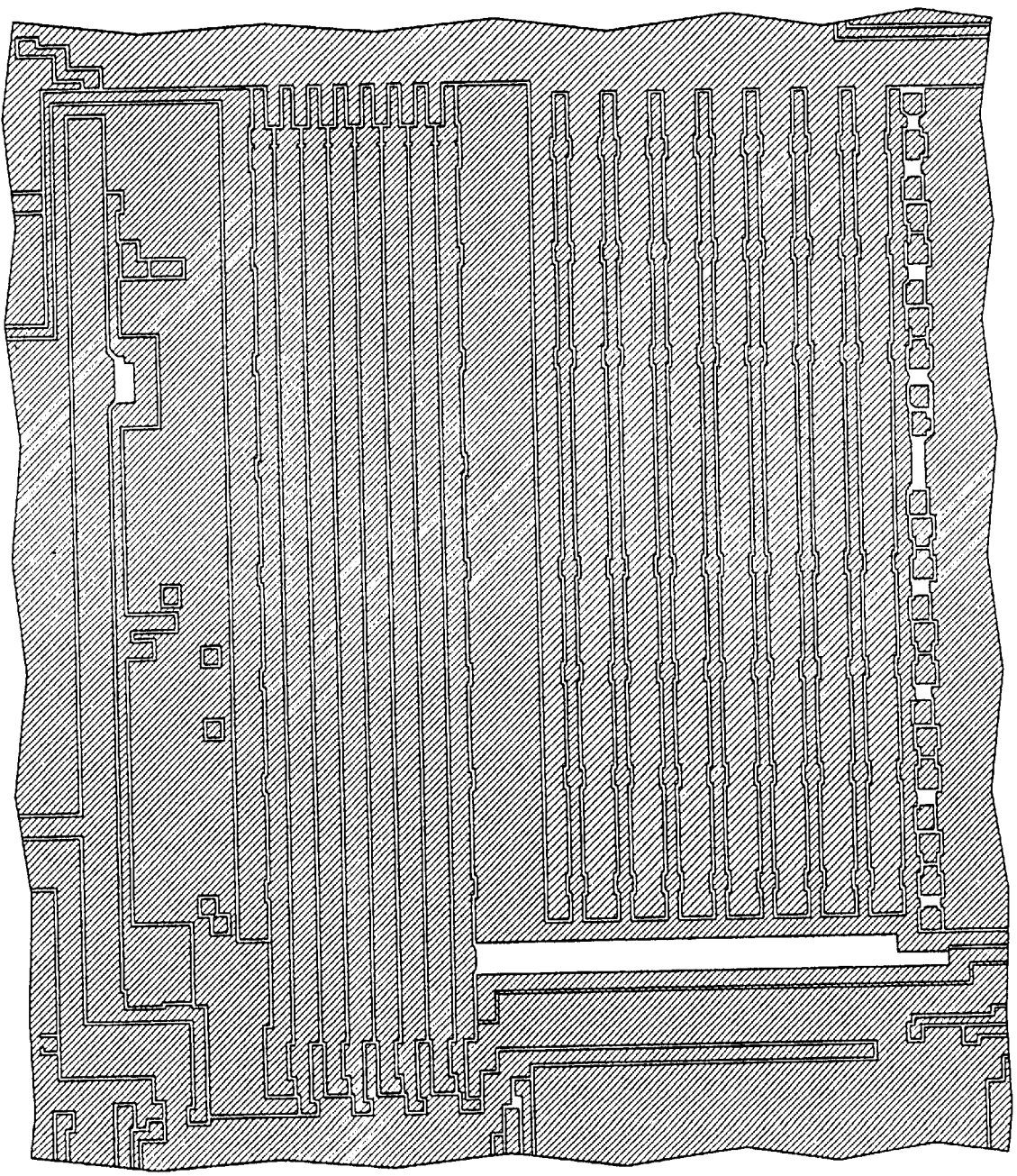
FIG. 3 is the same fragmentary, sectional view of an interconnect plane according to he invention.

In contrast, FIG. 3 shows an interconnect plane according to the invention, in which all of the lines are widened to such an extent that a minimum distance achievable according to the relevant state of a technology generation is provided between them. Through the use of this structure, on one hand optical examination of the circuit structure under the interconnect plane is no longer possible, and on the other hand, welding of individual conductors occurs if an attempt is made to remove conductors, so that short-circuits are created. Complete removal of the conductors would prevent the underlying circuit from functioning.

We claim:

1. A semiconductor chip, comprising:

a semiconductor substrate having at least one layer;

circuits produced in said at least one layer of said semiconductor substrate, said circuits disposed in at least one group;

at least one interconnect plane disposed over said circuits; and supply and signal lines extending in said at least one interconnect plane over at least one group of said circuits, said supply and signal lines having a width defining a distance between any two successive said lines being less than said width.

2. The semiconductor chip according to claim 1, wherein:

said supply and signal lines extend in said at least one interconnect plane over at least one group of said circuits, such that a surface of said chip over said at least one group of said circuits is substantially covered by said supply and signal lines in said interconnect plane.

* * * * *